United States Patent [19]

Mizukami et al.

[11] Patent Number: 4,731,875
[45] Date of Patent: Mar. 15, 1988

[54] FREQUENCY CONVERTER USED FOR A RECEIVER WHICH RECEIVES SIGNALS OF A UHF BAND OR A MICROWAVE BAND

[75] Inventors: Hiroyuki Mizukami; Masaki Noda; Toshio Nagashima; Keiro Shinkawa, all of Yokohama, Japan

[73] Assignee: Hitachi, Ltd., Tokyo, Japan

[21] Appl. No.: 827,626

[22] Filed: Feb. 10, 1986

[30] Foreign Application Priority Data

Feb. 8, 1985 [JP] Japan .................................. 60-21646

[51] Int. Cl.$^4$ .............................................. H04B 1/10
[52] U.S. Cl. .................................... 455/302; 455/303; 455/304; 455/317; 455/318; 455/327
[58] Field of Search ............... 455/182, 302, 303, 305, 455/306, 317, 318, 323, 327, 332, 304

[56] References Cited

U.S. PATENT DOCUMENTS

| | | | |
|---|---|---|---|
| 2,964,622 | 12/1960 | Fire | 455/302 |
| 3,159,790 | 12/1964 | Pratt | 455/326 |
| 3,515,993 | 6/1970 | Merriam | 455/326 |
| 3,831,097 | 8/1974 | Neuf | 455/326 |
| 4,584,715 | 4/1986 | Baars et al. | 455/302 |

Primary Examiner—Robert L. Griffin
Assistant Examiner—Elissa Seidenglanz
Attorney, Agent, or Firm—Antonelli, Terry & Wands

[57] ABSTRACT

A frequency converter which is capable of rejecting unnecessary signals generated by image signals. The frequency converter has first and second local oscillation circuits which generate local oscillation signals whose frequencies are the same and whose phases are different by 90 degrees from each other. The converter further includes two mixer circuits, and a hybrid coupler. The mixer circuits generate two unnecessary signals whose phases are different by 90 degrees from each other. The hybrid coupler delays one unnecessary signal by a quarter of a wavelength to generate two unnecessary signals whose phases are different by 180 degrees from each other, so that they are cancelled by each other.

5 Claims, 7 Drawing Figures

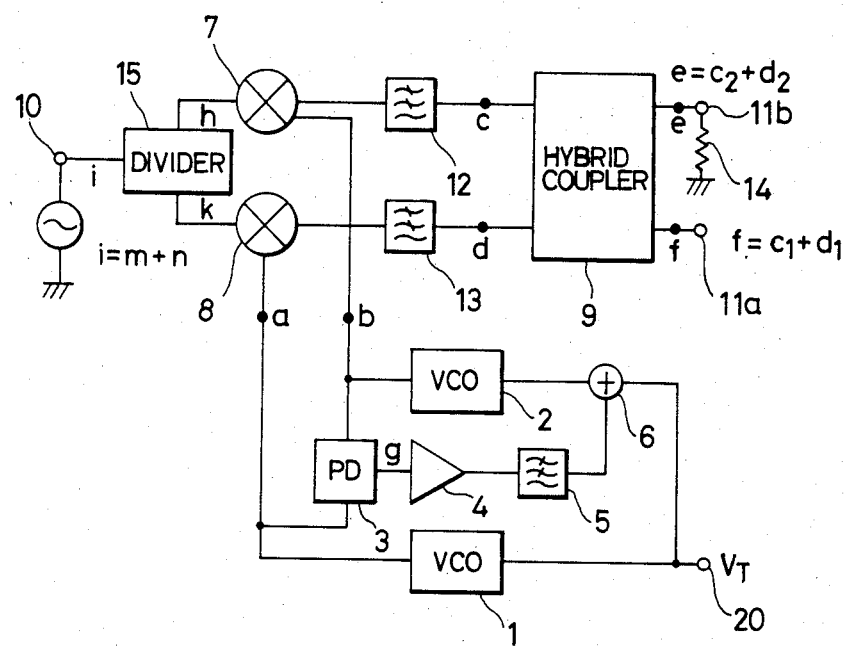
FIG. 1
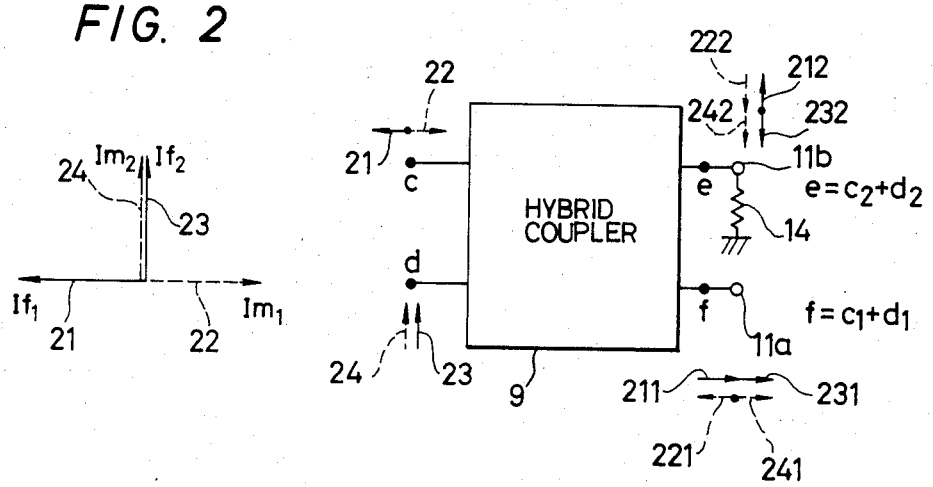
FIG. 2
FIG. 3

FREQUENCY CONVERTER USED FOR A RECEIVER WHICH RECEIVES SIGNALS OF A UHF BAND OR A MICROWAVE BAND

BACKGROUND OF THE INVENTION

1. Field of the Invention

The present invention relates to a frequency converter used for a receiver which receives signals in a UHF band or signals in a microwave band, and particularly to a frequency converter which is capable of easily attenuating interference signals generated by image signals.

2. Prior Art

Frequency converters have been known which are capable of attenuating image signals without using a narrow band-pass filter in a receiver which receives signals of a UHF band or signals of a microwave band, as disclosed in Japanese Patent Laid-Open Nos. 75709/1981 and 193106/1982.

These frequency converters usually have a plurality of signal dividers or hybrid couplers to generate two signals with phases that are different by 90 degrees, and two image signals with phases that are different by 180 degrees, so that the image signals are cancelled when the frequency of the main signals that are being received is converted. That is, interference signals generated by the image signals are removed.

In general, a signal divider used for the above-mentioned frequency converters is constituted by microstrip lines, and is not suited for obtaining two signals with a phase difference of 90 degrees over a wide frequency range, and is not hence capable of sufficiently attenuating interference signals generated by image signals for the input signals of a wide frequency region.

SUMMARY OF THE INVENTION

The object of the present invention is to provide a frequency converter which is capable of sufficiently rejecting undesired signals generated by image signals for the input signals over a broad frequency range (wide band).

In order to achieve the above-mentioned object, the signal converter of the present invention comprises first and second local oscillation circuits which, respectively, generate local oscillation signals having an equal frequency but phases that are different by 90 degrees relative to each other, a first mixer circuit which is served with local oscillation signals of the first local oscillation circuit, a second mixer circuit which is served with local oscillation signals of the second local oscillation circuit, a signal divider which distributes the received main signals and image signals to the first mixer circuit and to the second mixer circuit, and a hybrid coupler which is served with a first intermediate-frequency signal obtained from the first mixer circuit and a second intermediate-frequency signal obtained from the second mixer circuit.

A main signal and an image signal supplied from the signal divider to the first mixer circuit have phases $\theta m_1$ and $\theta i_1$, and a main signal and an image signal supplied from the signal divider to the second mixer circuit have phases $\theta m_2$ and $\theta i_2$, where ($\theta m_1 = \theta m_2$ and $\theta i_1 = \theta i_2$).

A local oscillation signal of the first local oscillation circuit has a phase which is different by 90 degrees from the phase of a local oscillation signal of the second local oscillation circuit. Therefore, the first intermediate-frequency signal obtained by the first mixer circuit has a phase which is different by 90 degrees from the phase of the second intermediate-frequency signal obtained by the second mixer circuit.

The hybrid coupler delays the second intermediate-frequency signal supplied from the second mixer circuit by a quarter of the wavelength ($\frac{1}{4}\lambda$ where $\lambda$ represents the wavelength of the first and second intermediate-frequency signals) with respect to the first intermediate-frequency signal supplied from the first mixer circuit, or delays the first intermediate-frequency signal supplied from the first mixer circuit by a quarter of the wavelength (174 $\lambda$) with respect to the second intermediate-frequency signal supplied from the second mixer circuit. The hybrid coupler then generates two unnecessary signals (undesired signals) of which the phases are different by 180 degrees to cancel unnecessary signals that are generated by image signals, and produces a signal that does not contain unnecessary signals.

BRIEF DESCRIPTION OF THE DRAWINGS

FIG. 1 is a block diagram of a frequency converter of the present invention;

FIG. 2 is a vector diagram which shows phases of two main signals contained in the two intermediate-frequency signals and phases of two unnecessary signals;

FIG. 3 is a diagram which shows phases of two main signals contained in the two intermediate-frequency signals input to the hybrid coupler, phases of two unnecessary signals, phases of two main signals contained in the two intermediate-frequency signals produced by the hybrid coupler, and phases of two unnecessary signals;

DETAILED DESCRIPTION OF THE PREFERRED EMBODIMENTS

Figure 4:
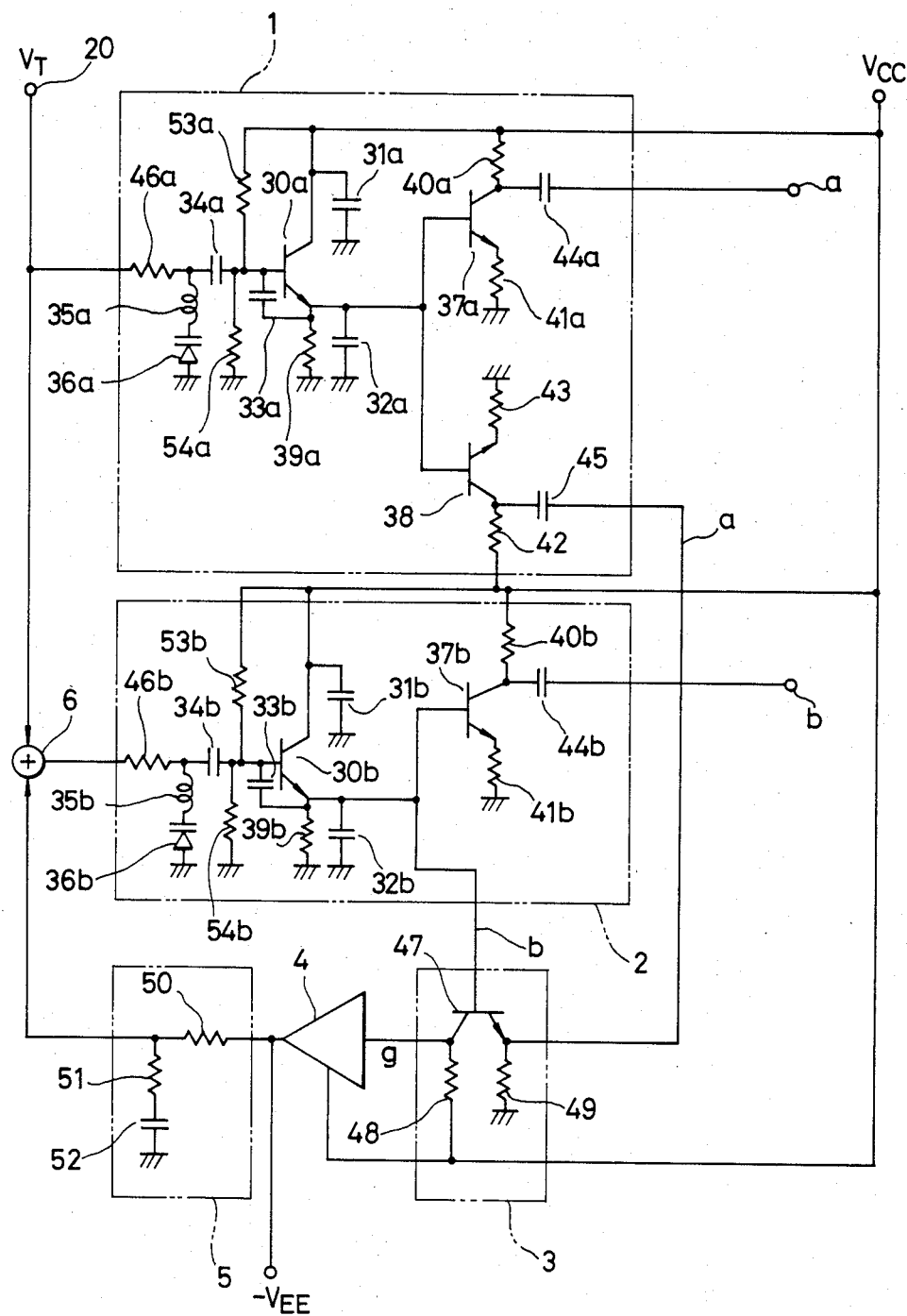
FIG. 4 is a diagram showing two local oscillation circuits, a phase detector, a loop amplifier and a loop filter.

An embodiment of the present invention will be described below in conjunction with FIG. 1. The frequency converter according to the present invention consists chiefly of a first voltage-controlled oscillator (VCO) 1, a second voltage-controlled oscillator (VCO) 2, mixers 7, 8, a divider 15, and a hybrid coupler 9.

The first voltage-controlled oscillator VCO 1 serves as a first local oscillation circuit which produces a local oscillation signal a that will be supplied to the mixer 8. The second voltage-controlled oscillator VCO 2 serves as a second local oscillation circuit which produces a local oscillation signal b that will be supplied to the mixer 7. Oscillation frequencies of the oscillation circuits VCO 1, VCO 2 change depending upon a channel select voltage $V_T$ that is supplied to a frequency control terminal 20. Output signals a, b of the oscillation circuits VCO 1, VCO 2 are further supplied to a phase detector 3 which compares the phase of the output signal a with the phase of the output signal b, and which generates a phase error signal g that will be supplied to an adder 6 via a loop amplifier 4 and a loop filter 5. The adder 6 adds the phase error signal g supplied from the phase detector 3 to the channel select voltage $V_T$. Therefore, the oscillation frequency of the oscillation circuit VCO 2 is also subject to be changed by the phase error signal g. The oscillation circuit VCO 2, phase detector 3, loop amplifier 4 and loop filter 5 form a phase locked loop (PLL). Under the condition in which the PLL is locked, the frequency of the output signal b of the oscillation circuit VCO 2 is equal to the frequency of the output signal a of the oscillation circuit VCO 1, and the phase of the output signal b of the oscillation circuit VCO 2 is different by 90 degrees from the phase of the output signal a of the oscillation circuit VCO 1.

A signal i input to an input terminal 10 is supplied to the divider 15 which divides the input signal i into a divided signal h and a divided signal k, the signal h being supplied to the mixer circuit 7 and the signal k being supplied to the mixer circuit 8. The input signal i and the signals h and k contain the main signal m and the image signal n that are received. The signal k has a phase which is equal to the phase of the signal h. The frequency of signal h is changed into an intermediate frequency by the local oscillation signal b in the mixer circuit 7, and is converted into an intermediate-frequency signal c. The intermediate-frequency signal c is supplied to the hybrid coupler 9 via a filter 12. The frequency of signal k is changed into an intermediate-frequency by the local oscillation signal a in the mixer circuit 8, and is converted into an intermediate-frequency signal d which is supplied to the hybrid coupler 9 via a filter 13. The phase of the intermediate-frequency signal c is different by 90 degrees from the phase of the intermediate-frequency signal d. The hybrid coupler 9 divides the intermediate-frequency signal c into two signals $c_1$ and $c_2$, and supplies one signal $c_1$ to an output terminal 11a and supplies another signal $c_2$ to an output terminal 11b. The phase of the signal c is different by 180 degrees from the phase of the signal $c_1$, and is different by 90 degrees from the phase of the signal $c_2$. Therefore, the phase of the signal $c_1$ is different by 90 degrees (i.e., $\frac{1}{4}\lambda$) from the phase of the signal $c_2$. The hybrid coupler 9 further divides the intermediate-frequency signal d into two signals $d_1$ and $d_2$, and supplies one signal $d_1$ to the output terminal 11a and supplies another signal $d_2$ to the output terminal 11b. The phase of the signal d is different by 90 degrees from the phase of the signal $d_1$, and is different by 180 degrees from the phase of the signal $d_2$. Therefore, the phase of the signal $d_1$ is different by 90 degrees, i.e., different by $\frac{1}{4}\lambda$ from the phase of the signal $d_2$. The signal $c_1$ and the signal $d_1$ supplied to the output terminal 11a are added up together to form a signal f. Further, the signal $c_2$ and the signal $d_2$ supplied to the output terminal 11b are added up together to form a signal e. The signal e flows through a terminal resistance 14. The signal f is produced from the output terminal 11a. The intermediate-frequency signals c and d contain a main signal (necessary signal) of which the frequency is converted and an interference signal (unnecessary signal) generated by the image signal. However, the unnecessary signal contained in the intermediate-frequency signal c and the unnecessary signal contained in the intermediate-frequency signal d are cancelled by each other, so that the output signal f does not contain unnecessary signal. The reasons will be described below.

When the main signal m contained in the input signal i that is supplied to the input terminal 10 has an amplitude Es and a frequency Ws, the waveform Em of the main signal m is given by, $$Em = E_s \sin 2\pi W_s \cdot t \quad (1)$$

where t denotes the time.

When the local oscillation signal a generated by the oscillation circuit VCO 1 has an amplitude El and a frequency Wl, the waveform Ea of the local oscillation signal a is given by, $$Ea = El \cos 2\pi Wl \cdot t \quad (2)$$

The local oscillation signal b generated by the oscillation circuit VCO 2 has a phase which is different by 90 degrees from the phase of the local oscillation signal a. Therefore, its waveform Eb is given by, $$Eb = El \sin 2\pi Wl \cdot t \quad (3)$$

When the image signal n supplied to the input terminal 10 has an amplitude $E_{IM}$ and a frequency $W_{IM}$, the waveform En of the image signal n is given by, $$En = E_{IM} \sin 2\pi W_{IM} \cdot t \quad (4)$$

A relation among the frequency $W_{IM}$ of the image signal n, a frequency Ws of the main signal m, and a frequency Wl of the oscillation circuits VCO 1, VCO 2, is given by the following equation (5), $$W_{IM} = 2Wl - Ws \quad (5)$$

If the frequency of the intermediate-frequency signals c, d is selected to have a value lower than the frequency of the input signal i, the main signal and the unnecessary signal contained in the intermediate-frequency signals c, d are given by the equations described below.

From the equations (1) and (2), the main signal $If_1$ generated by the mixer circuit 7 is given by the following equation (6), $$\sin 2\pi Ws \cdot t \times \cos 2\pi Wl \cdot t \to \sin 2\pi(Wl - Ws) \cdot t \quad (6)$$

From the equations (2) and (4), the unnecessary signal $Im_1$ generated in the mixer circuit is given by the following equation (7), $$\sin 2\pi W_{IM} \cdot t \times \cos 2\pi Wl \cdot t \to \sin 2\pi(Wl - W_{IM}) \cdot t \quad (7)$$
$$\to -\sin 2\pi(Wl - Ws) \cdot t$$

From the equations (1) and (3), furthermore, the necessary signal (desired signal) $If_2$ tenerated by the mixer circuit 8 is given by the following equation (8).

$$\sin 2\pi Ws \cdot t \times \sin 2\pi Wl \cdot t \to \cos 2\pi(Wl - Ws) \cdot t \quad (8)$$

From the equations (3) and (4), the unnecessary signal $Im_2$ generated by the mixer circuit 8 is given by the following equation (9), $$\sin 2\pi W_{IM} \cdot t \times \sin 2\pi Wl \cdot t \to \cos 2\pi(Wl - W_{IM}) \cdot t \quad (9)$$
$$\cos 2\pi(Wl - Ws) \cdot t$$

FIG. 2 shows phases of the necessary signals $If_1$, $If_2$ and phases of the unnecessary signals $Im_1$, $Im_2$. As is obvious from FIG. 2 and the equations (6) and (7), the necessary signal $If_1$ has the phase 21 which is different by 180 degrees from the phase 22 of the unnecessary signal $Im_1$. As is obvious from FIG. 2 and the equations (8) and (9), furthermore, the necessary signal $If_2$ has the phase 23 which is equal to the phase 24 of the unnecessary signal $Im_2$.

FIG. 3 shows phases of the signals $c_1$, $c_2$, $d_1$, $d_2$ supplied from the hybrid coupler 9 to the output terminals 11a, 11b. The intermediate-frequency signal c is supplied to the output terminal 11a with its phase being changed by 180 degrees. Therefore, the necessary signal $If_1$ contained in the signal $c_1$ has the phase 211, and the unnecessary signal $Im_1$ has the phase 221. The intermediate-frequency signal d is supplied to the output terminal 11a with its phase being changed by 90 degrees. Therefore, the necessary signal $If_2$ has the phase 231 and the unnecessary signal $Im_2$ has the phase 241. The unnecessary signal $Im_1$ has the phase 221 which is different by 180 degrees from the phase 241 of the unnecessary signal $Im_2$. Therefore, the unnecessary signals $Im_1$ and $Im_2$ are cancelled by each other, and are, therefore, rarely produced on the output terminals 11a. The necessary signal $If_1$ has the phase 211 which is equal to the phase 231 of the necessary signal $If_2$. Therefore, necessary signals $(If_1+If_2)$ appear on the output terminal 11a. Furthermore, the intermediate-frequency signal c is supplied to the output terminal 11b with its phase being changed by 90 degrees. Therefore, the necessary signal $If_1$ contained in the signal $C_2$ has the phase 212, and the unnecessary signal $Im_1$ has the phase 222. The intermediate-frequency signal d is supplied to the output terminal 11b with its phase being changed by 180 degrees. Therefore, the necessary signal $If_2$ has the phase 232 and the unnecessary signal $Im_2$ has the phase 242. The necessary signal $If_1$ has the phase 212 which is different by 180 degrees from the phase 232 of the necessary signal $If_2$. Therefore, these two signals are cancelled by each other. The unnecessary signal $Im_1$ has the phase 222 which is the same as the phase 242 of the unnecessary signal $Im_2$. Accordingly, unnecessary signals $(Im_1+Im_2)$ only appear on the output terminal 11b. The unnecessary signals $(Im_1+Im_2)$ flow through the terminal resistance 14. The necessarey signals $(If_1+If_2)$ appearing on the output terminal 11a are produced from the output terminal 11a.

The hybrid coupler 9 is constituted, for example, by microstrip lines. The intermediate-frequency signals c, d have nearly a constant value. Therefore, the hybrid coupler 9 may have a narrow pass band.

FIG. 4 is a circuit diagram which concretely illustrates the oscillation circuits VCO 1, VCO 2, phase detector 3, loop amplifier 4 and loop filter 5.

The oscillation circuit VCO 1 is constituted by a Clapp oscillation circuit which consists of a transistor 30a, capacitors 31a, 32a, 33a, 34a, an inductor 35a, and a variable-capacity diode 36a, and by a buffer amplifier which consists of transistors 37a and 38. Resistors 39a, 40a, 41a, 42, 43, 53a, and 54a supply a bias current to the transistor 30a, 38 or 37a. Capacitors 44a and 45a are coupling capacitors. A resistor 46a applies a channel select voltage $V_T$ to the variable-capacity diode 36a.

The oscillation circuit VCO 2 is constituted by a Clapp oscillation circuit which consists of a transistor 30b, capacitors 31b, 32b, 33b, 34b, an inductance 35b, and a variable-capacity diode 36b, and by a buffer amplifier circuit which consists of a transistor 37b. Resistors 39b, 40b, 41b, 53b and 54b supply a bias current to the transistor 30b or 37b. A capacitor 44b is a coupling capacitor. A resistor 46b applies the channel select voltage $V_T$ to the variable-capacity diode 36b.

The phase detector 3 is constituted by a transistor 47 and resistors 48, 49 which supply a bias current to the transistor 47, the loop amplifier 4 is constituted by, for example, a differential amplifier or the like, and the loop filter 5 is constituted by a filter consisting of resistors 50, 51 and a capacitor 52.

An output signal a of the oscillation circuit VCO 1 is input to the emitter of the transistor 47 of the phase detector 3, and an oscillation output signal b which is branched from the oscillation circuit VCO 2 is input to the base of the transistor 47. The output signal a and the output signal b are multiplied by the transistor 47. A phase error signal g is supplied from the collector of the transistor 47 to the adder 6 via the loop amplifier 4 and loop filter 5. The error signal g is superposed on the channel select voltage $V_T$ by the adder 6, and is applied to the variable-capacity diode 36b in the oscillation circuit VCO 2. Therefore, an output signal b is produced by the oscillation circuit VCO 2 as an oscillation output signal b having a phase difference of 90 degrees with respect to the oscillation output signal a of the oscillation circuit VCO 1.

Figure 5:
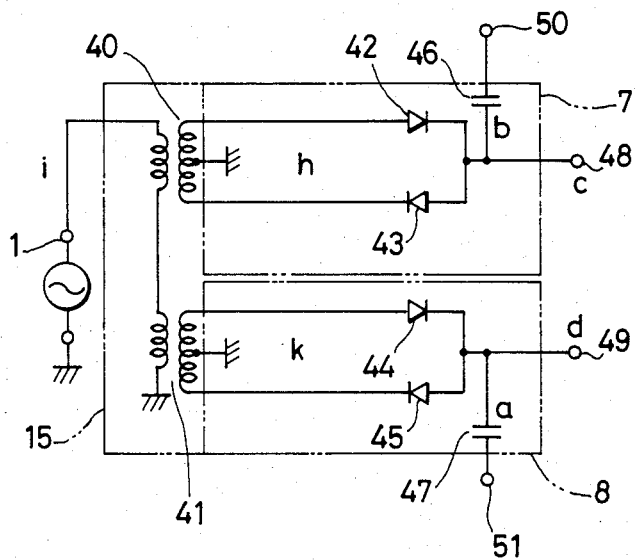
FIG. 5 is a diagram showing a signal divider and two mixer circuits.

FIG. 5 is a circuit diagram which concretely illustrates the signal divider and the mixer circuit. The input signal i supplied to the input terminal 1 is divided into a signal h and a signal k by transformers 40, 41 in the signal divider 15, the signal h being supplied to the mixer circuit 7 and the signal k being supplied to the mixer circuit 8. The mixer circuits 7, 8 are constituted by diodes 42, 43, 44, 45. The local oscillation signal is supplied to the diodes 44, 45 from a terminal 51 through the capacitor 47, and the local oscillation signal b is supplied to the diodes 42, 43 from a terminal 50 through the capacitor 46. The signal c obtained by the mixer circuit 7 is produced from a terminal 48. The signal d obtained by the mixer circuit 8 is produced from a terminal 49. The capacitors 46, 47 exhibit high impedances for the signals c, d. The signal h has the phase which is the same as the phase of the signal k, that is supplied from the signal divider 15 to the mixer circuits 7, 8.

Figure 6:
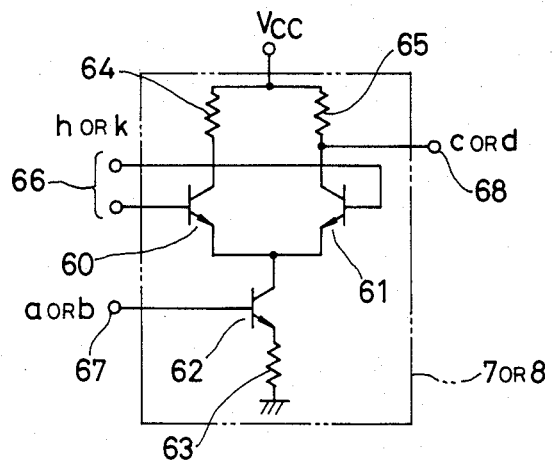
FIG. 6 is a diagram of a mixer circuit.

FIG. 6 shows a second embodiment of the mixer circuit. The mixer circuit 7 or 8 consists of transistors 60, 61, 62 and resistors 63, 64, 65. The input signal h or k is supplied to the input terminal 66, and the local oscillation signal a or b is supplied to the terminal 67. The signal h (or k) and the signal b (or a) are multiplied, and the resulting signal c (or d) is produced from an output terminal 68.

Figure 7:
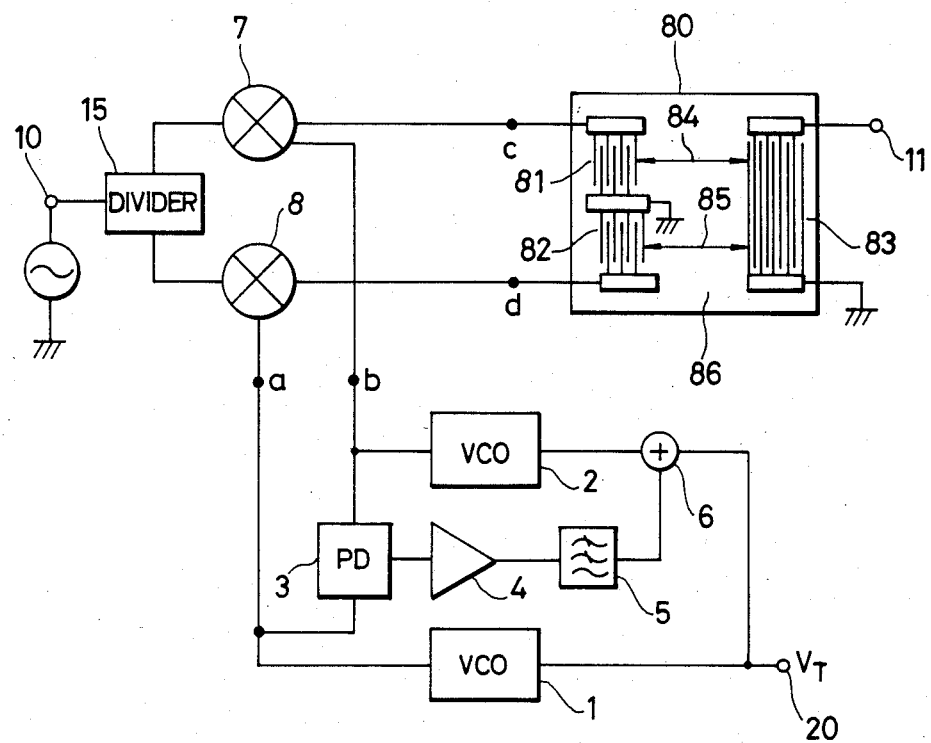
FIG. 7 is a block diagram showing a second embodiment of the present invention.

FIG. 7 illustrates a second embodiment of the present invention, wherein a hybrid coupler 80 is constituted by a surface acoustic wave (SAW) filter. The hybrid coupler 80 consists of two electrodes 81, 82 formed on a piezo-electric substrate 86, and an output electrode 83. The intermediate-frequency signal c is supplied to the input electrode 81, and the intermediate-frequency signal d is supplied to the input electrode 82. The intermediate-frequency signal c supplied to the input electrode 81 is converted into an elastic wave through the input electrode 81, passes through a propagation path 84, and reaches the output electrode 83 where it is converted again into an electric signal. The intermediate-frequency signal d supplied to the input electrode 82 is converted into an elastic wave through the input electrode 82, passes through a propagation path 85, and reaches the output electrode 83 where it is converted again into an electric signal. The propagation path 84 is longer than the propagation path 85 by a quarter of the wave length ($\frac{1}{4}\lambda$) of the elastic wave of the intermediate-frequency signal c or d. Therefore, the intermediate-frequency signal c arrives at the output electrode 83 with its phase being lagged by 90 degrees, i.e., by ¼λ behind the intermediate-frequency signal d. The main signal $If_1$ contained in the intermediate-frequency signal c has the phase 21 which is in advance by 90 degrees of the phase 23 of the main signal $If_2$ contained in the intermediate-frequency signal d. Therefore, the necessary signals $If_1$, $If_2$ arriving at the output electrode 83 have the same phase. The unnecessary signal $Im_1$ contained in the intermediate-frequency signal c has the phase 22 which is lagged by 90 degrees behind the phase 24 of the unnecessary signal $Im_2$ contained in the intermediate-frequency signal d. Therefore, the unnecessary signal $Im_1$ has the phase that is different by 180 degrees from the phase of the unnecessary signal $Im_2$, that are arriving at the output electrode 83. Therefore, only the necessary signals $(If_1+If_2)$ are generated from the output electrode 83; and the unnecessary signal is not generated from the output electrode 83. The necessary signals $(If_1+If_2)$ generated on the output electrode 83 are produced from the output terminal 11. The SAW filter 80 used in the second embodiment has been described in Electron Letters, Vol. 13, No. 19, pp. 586–588, "4-Phase P.S.K. Differential Demodulator using A.S.W. Delay Line", Henaff and Carel. By suitably selecting the shapes of the electrodes 81, 82 and 83 of the SAW filter 80, the SAW filter 80 exhibits the same functions as the filters 12, 13 shown in FIG. 1.

According to the present invention as described above, two local oscillation signals having an equal frequency but having phases that are different by 90 degrees from each other, are used to generate two unnecessary signals having phases that are different by 90 degrees from each other over a wide frequency range. Further, another two unnecessary signals having phases that are different by 180 degrees from each other are generated by a hybrid coupler, whereby the two unnecessary signals are cancelled by each other, and necessary signals are obtained without containing unnecessary signals.

We claim:

1. A frequency converter comprising:
   (a) a signal divider which has an input terminal to which will be input an input signal that contains a main signal and an image signal, and which divides the input signal supplied to said input terminal into a first divided input signal and a second divided input signal;
   (b) a first local oscillation signal generator circuit which has a frequency control terminal that is served with a channel select voltage, and a first voltage-controlled oscillator which generates a first local oscillation signal whose oscillation frequency changes depending upon the channel select voltage supplied to said frequency control terminal;
   (c) a second local oscillation signal generator circuit which generates a second local oscillation signal, the frequency of said second local oscillation signal being equal to the frequency of the first local oscillation signal generated by said first local oscillation signal generator circuit, and the phase of the second local oscillation signal being different by 90 degrees from the phase of the first local oscillation signal;
   (d) a first mixer circuit which is connected to said signal divider and to said first local oscillation signal generator circuit, which is served with the first divided input signal from said signal divider and with the first local oscillation signal from said first local oscillation signal generator, and which generates a first intermediate-frequency signal of a wavelength λ that contains a first necessary signal obtained from the main signal and a first unnecessary signal obtained from the image signal, responsive to the first divided input signal and the first local oscillation signal;
   (e) a second mixer circuit which is connected to said signal divider and to said second local oscillation signal generator circuit, which is served with the second divided input signal from said signal divider and with the second local oscillation signal from said second local oscillation signal generator, and which generates a second intermediate-frequency signal of a wavelength λ that contains a second necessary signal obtained from the main signal and a second unnecessary signal obtained from the image signal, responsive to the second divided input signal and the second local oscillation signal; and
   (f) a hybrid coupler which is connected to said first and second mixer circuits, which is served with the first intermediate-frequency signal from said first mixer circuit and with the second intermediate-frequency signal from said second mixer circuit, which has at least one output terminal, which supplies the first intermediate-frequency signal to the output terminal thereof, and which supplies the said second intermediate-frequency signal to the output terminal thereof, the second intermediate-frequency signal being delayed by a quarter of the wavelength (¼λ) behind the first intermediate-frequency signal, such that the phase of the first unnecessary signal is different by 180 degrees from the phase of the second unnecessary signal, and that the first and second unnecessary signals are cancelled by each other;
   wherein the hybrid coupler is constituted by a surface acoustic wave filter which consists of a first input electrode, a second input electrode, and an output electrode, and which propagates elastic waves, and wherein the first input electrode is connected to the first mixer circuit, the second input electrode is connected to the second mixer circuit, and the distance between the second input electrode and the output electrode is greater than the distance between the first input electrode and the output electrode by a quarter of the wavelength of the elastic wave.

2. A frequency converter according to claim 1, wherein said second local oscillation signal generator circuit is comprised of:
   a second voltage-controlled oscillator which is served with the channel select voltage from said frequency control terminal, and which generates a second local oscillation signal whose oscillation frequency changes depending upon the channel select voltage;
   a phase detector which is served with the first local oscillation signal from the first voltage-controlled oscillator, and with the second local oscillation signal from the second voltage-controlled oscillator, which compares the phase of the first local oscillation signal with the phase of the second local oscillation signal, and which generates a phase error signal;

a loop filter which is connected to the phase detector and is served with the phase error signal from the phase detector; and an adder which is connected to the loop filter and which adds the output signal of the loop filter filter to the channel select voltage.

3. A frequency converter comprising:

(a) a signal divider, having an input terminal for receiving an input signal containing a main signal and an image signal supplied to said input terminal, for dividing said input signal supplied to said input terminal into a first divided input signal and a second divided input signal;

(b) a first local oscillation signal generator circuit having a frequency control terminal supplied with a channel select voltage, and a first voltage-controlled oscillator for generating a first local oscillation signal having an oscillation frequency which changes depending upon said channel select voltage supplied to said frequency control terminal;

(c) a second local oscillation signal generator circuit including a second voltage-controlled oscillator supplied with said channel select voltage from said frequency control terminal for generating a second local oscillation signal having a frequency which changes depending upon said channel select voltage and which is equal to the frequency of said first local oscillation signal generated by said first local oscillation signal generator circuit, said second local oscillation signal having a phase different by 90 degrees from the phase of said first local oscillation signal;

(d) a phase detector, connected to receive said first local oscillation signal from said first voltage-controlled oscillator and said second local oscillation signal from said second voltage-controlled oscillator, for comparing said phase of said first local oscillation signal with said phase of said second local oscillation signal, and for generating a phase error signal based on the comparison;

(e) a loop filter connected to said phase detector so as to be supplied with said phase error signal;

(f) an adder connected to said loop filter for adding an output signal of said loop filter to said channel select voltage;

(g) a first mixer circuit connected to said signal divider and to said first local oscillation signal generator circuit, and being supplied with said first divided input signal from said signal divider and with said first local oscillation signal from said first local oscillation signal generator, for generating a first intermediate-frequency signal of a wavelength $\lambda$ that contains a first necessary signal obtained from said main signal and a first unnecessary signal obtained from said image signal in response to said first divided input signal and said first local oscillation signal;

(h) a second mixer circuit connected to said signal divider and to said second local oscillation signal generator circuit, and being supplied with said second divided input signal from said signal divider and with said second local oscillation signal from said second local oscillation signal generator, for generating a second intermediate-frequency signal of a wavelength $\lambda$ that contains a second necessary signal obtained from said main signal and a second unnecessary signal obtained from said image signal in response to said second divided input signal and said second local oscillation signal; and (i) a hybrid coupler connected to said first and second mixer circuits, and being supplied with said first intermediate-frequency signal from said first mixer circuit and with said second intermediate-frequency signal from said second mixer circuit, said hybrid coupler having at least one output terminal for outputting said first intermediate-frequency signal and said second intermediate-frequency signal, said second intermediate-frequency signal being delayed by a quarter of a wavelength ($\frac{1}{4}\lambda$) behind said first intermediate-frequency signal, such that the phase of said first unnecessary signal is different by 180 degrees from the phase of said second unnecessary signal, and such that said first and second unnecessary signals are cancelled by each other.

4. A frequency converter according to claim 3, wherein said hybrid coupler comprises a surface acoustic wave filter for propagating elastic waves, including a first input electrode, a second input electrode, and an output electrode, and said first input electrode being connected to the first mixer circuit, said second input electrode being connected to said second mixer circuit, and wherein the distance between said second input electrode and said output electrode is greater than the distance between said first input electrode and said output electrode by a quarter of said wavelength ($\frac{1}{4}\lambda$) of said elastic wave.

5. A frequency converter according to claim 3, wherein said signal divider has a first transformer and a second transformer connected in series with each other, and said second transformer is also connected to said input terminal.

* * * * *